US009251774B2

(12) United States Patent
Shinoda et al.

(10) Patent No.: US 9,251,774 B2
(45) Date of Patent: Feb. 2, 2016

(54) SIGNAL PROCESSOR FOR MUSICAL PERFORMANCE OF WIND INSTRUMENT USING A MUTE

(71) Applicant: Yamaha Corporation, Hamamatsu-shi, Shizuoka-ken (JP)

(72) Inventors: Ryo Shinoda, Hamamatsu (JP); Hisako Takano, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 136 days.

(21) Appl. No.: 14/038,271

(22) Filed: Sep. 26, 2013

(65) Prior Publication Data

US 2014/0090544 A1 Apr. 3, 2014

(30) Foreign Application Priority Data

Sep. 27, 2012 (JP) ................................ 2012-214768

(51) Int. Cl.

| | |
|---|---|
| ***G10H 1/46*** | (2006.01) |
| ***H03G 3/00*** | (2006.01) |
| ***G10H 1/00*** | (2006.01) |
| ***G10D 9/06*** | (2006.01) |
| ***G10H 1/12*** | (2006.01) |

(52) U.S. Cl.

CPC ............... *G10H 1/0091* (2013.01); *G10D 9/06* (2013.01); *G10H 1/12* (2013.01); *G10H 2230/171* (2013.01)

(58) Field of Classification Search

CPC ..... G10H 1/46; G10H 1/02; G10H 2210/155; G10H 2250/461; G10D 9/06; G10D 9/026; G10D 7/00; G10G 1/00; H04R 2430/01; H04S 1/005; G10K 11/002; G10K 11/175; G10K 2210/1081

See application file for complete search history.

(56) References Cited

U.S. PATENT DOCUMENTS

| | | | | |
|---|---|---|---|---|
| 2,574,591 | A | 11/1951 | Rudd | |
| 5,569,864 | A * | 10/1996 | Hamanaga et al. | 84/400 |
| 6,737,572 | B1 * | 5/2004 | Jameson et al. | 84/741 |
| 2002/0018573 | A1 | 2/2002 | Schwartz | |
| 2003/0209131 | A1 * | 11/2003 | Asahi | 84/485 R |
| 2004/0144239 | A1 * | 7/2004 | Sakurada | 84/616 |
| 2005/0056139 | A1 * | 3/2005 | Sakurada | 84/616 |

(Continued)

FOREIGN PATENT DOCUMENTS

| | | |
|---|---|---|
| EP | 0 712 112 A2 | 5/1996 |
| JP | 2-119697 U | 9/1990 |
| JP | 11-52836 A | 2/1999 |

(Continued)

OTHER PUBLICATIONS

Japanese Office Action dated Sep. 24, 2014 with partial English translation (Four (4) pages).

(Continued)

*Primary Examiner* — Marlon Fletcher

(74) *Attorney, Agent, or Firm* — Crowell & Moring LLP

(57) ABSTRACT

A mute unit 20 is attached to a trumpet. Inside the mute unit 20, a microphone 21 is mounted, so that a sound collected by the microphone 21 is converted to an electric signal. The electric signal is supplied to a signal processor 30. The signal processor 30 processes the electric signal converted by the microphone 21 such that changes in frequency characteristic of the sound caused by the mute unit 20 are cancelled. The signal processor 30 then outputs the processed signal.

10 Claims, 5 Drawing Sheets

(56) References Cited

U.S. PATENT DOCUMENTS

| | | | | |
|---|---|---|---|---|
| 2005/0076774 A1* | 4/2005 | Sakurada | ........................ | 84/616 |
| 2005/0217464 A1* | 10/2005 | Onozawa et al. | ............... | 84/723 |

FOREIGN PATENT DOCUMENTS

| | | | |
|---|---|---|---|
| JP | 2005-503694 | A | 2/2005 |
| JP | 2006-209146 | A | 8/2006 |
| JP | 4114171 | B2 | 7/2008 |
| JP | 4124236 | B2 | 7/2008 |
| JP | 3145588 | U | 10/2008 |
| JP | 4521778 | B2 | 8/2010 |

OTHER PUBLICATIONS

Horner A: “Wavetable Modeling of Muted Brass Tones”, Journal of the Audio Engineering Society, Audio Engineering Society, New York, NY, US, vol. 45,No. 4,Apr. 1, 1997, pp. 241-252. XP000700662, ISSN:1549-4950.

John Backus: Input impedance curves for the brass instruments, J. Acoust.Soc.Am, vol. 60, No. 2, Aug. 1, 1976, pp. 470-480,XP001419364.

Extended European Search Report dated Feb. 5, 2014 (six (6) pages).

* cited by examiner

SIGNAL PROCESSOR FOR MUSICAL PERFORMANCE OF WIND INSTRUMENT USING A MUTE

BACKGROUND OF THE INVENTION

1. Field of the Invention

The present invention relates to a signal processor for musical performance of a wind instrument using a mute for reducing volume of sounds generated by the wind instrument (sounds of the musical instrument).

2. Description of the Related Art

Conventionally, as described in Japanese Patent Publication No. 4114171 and Japanese Patent Publication No. 4124236 for example, it has been well known that a mute (silencer) is attached to a bell of a brass instrument such as a trumpet to reduce (mute) volume of sounds emitted by the instrument to the outside of the instrument, with a microphone being embedded in the mute so that a player of the instrument can listen to sounds collected by the microphone through earphones as sounds emitted by the instrument.

As described in Japanese Patent Publication No. 4521778 and Japanese Utility Model Registration No. 3145588, furthermore, it has also been well known that a wood wind instrument such as a saxophone is housed in a mute (silencer) formed of an enclosed housing to reduce (mute) volume of sounds emitted by the instrument to the outside of the instrument, with a microphone being embedded in the mute so that a player of the instrument can listen to sounds collected by the microphone through earphones as sounds emitted by the instrument.

Furthermore, Japanese Unexamined Patent Publication No. 11-52836 discloses an art for resolving the difference in localization of sound image between a case where sounds reproduced by earphones are localized inside a head of a player, more specifically, where a player listens to sounds supplied by a microphone embedded in a mute (silencer) through earphones as sounds of a musical instrument as described above, and a case where the wind instrument is played without the mute. In the art, electric signals supplied from the microphone embedded in the mute are processed by a sound image localization filter which performs convolution operation on the electric signals so that the player can listen to reproduced sounds of the wind instrument at a position of sound localization of the case where the wind instrument is played without the mute.

SUMMARY OF THE INVENTION

As in the cases of the conventional arts disclosed in the above-described Japanese Patent Publication No. 4114171, Japanese Patent Publication No. 4124236, Japanese Patent Publication No. 4521778 and Japanese Utility Model Registration No. 3145588, however, when a player listens to sounds of a wind instrument supplied from a microphone embedded in a mute through earphones, these conventional arts are disadvantageous in that sounds of the wind instrument with the mute are different from sounds of a wind instrument without a mute, due to, for example, unnatural operation noise caused by manipulation of piston valves (operating elements) of the wind instrument, uncomfortable noise caused by tonguing, muffled (muted) sounds caused by the mute, and disturbing high frequency noise. These disadvantages are caused by changes in frequency characteristic of sounds collected by the microphone due to the existence of the mute. Although by the art disclosed in the above-described Japanese Unexamined Patent Publication No. 11-52836, electric signals supplied from the microphone are processed, the signal processing only controls the position of the sound image reproduced through the earphones and localized inside a head, but does not correct the changes in frequency characteristic caused by the mute. Therefore, this art is also disadvantageous similarly to the other arts disclosed in Japanese Patent Publication No. 4114171, Japanese Patent Publication No. 4124236, Japanese Patent Publication No. 4521778 and Japanese Utility Model Registration No. 3145588.

The present invention was accomplished to solve the above-described problem, and an object thereof is to provide a signal processor which converts, in a case where a wind instrument is played with a mute being attached to the instrument to allow a player of the instrument to listen to sounds emitted inside the instrument and collected by a microphone, sounds collected by the microphone to electric signals, and processes the converted electric signals so that the player can listen to sounds similar to sounds of the wind instrument without the mute. As for descriptions for respective constituents of the present invention described below, numbers corresponding to components of a later-described embodiment are given in parenthesis for easy understanding. However, the respective constituents of the present invention are not limited to the corresponding components indicated by the numbers of the embodiment.

In order to achieve the above-described object, it is a feature of the present invention to provide a signal processor for use in musical performance of a wind instrument using a mute (20) for reducing volume of a sound generated by the wind instrument, the signal processor including a signal processing circuit (30) which receives an electric signal converted from a sound generated in a state where the mute is used, processes the received electric signal to cancel changes in frequency characteristic of the sound caused by the mute, and then outputs the processed electric signal.

In this case, the mute may be a mute unit which is to be inserted into a bell (13) of the wind instrument, or a mute case which houses the wind instrument, for example. The bell of the wind instrument is a portion which is a near an outlet of breath in which a diameter of a tube is gradually broadened for increasing volume of sounds of the wind instrument. Furthermore, the signal processing circuit may be formed of a FIR filter (32, 32*a*, 32*b*) for performing convolution operation on a received electric signal, and a filtering coefficient memory (33, 33*a*, 33*b*, 33*c*) storing filtering coefficients which are to be used for the convolution operation performed by the FIR filter to determine a transfer function, for example. In this case, the filtering coefficient memory may store one set of filtering coefficients or may plural sets of filtering coefficients. In the case of storing the plural sets of filtering coefficients, the signal processor may have a selecting portion which selects one set of filtering coefficients from among plural sets of filtering coefficients stored in the filtering coefficient memory to supply the selected one set of filtering coefficients to the FIR filter. The filtering coefficients are previously obtained according to first to third modes which will be described next, and are used in order to realize transfer functions performed by the signal processing circuit.

The signal processing circuit may work in the following first to third modes. In the first mode, the signal processing circuit receives an electric signal (S1) converted from a sound collected inside the mute or near the mute in a state where the mute is used, and the signal processing circuit processes the received electric signal on the basis of inverse characteristic ($G1^{-1}$) of first transfer characteristic (G1) from a first sound receiving point inside a mouthpiece (11) or near the mouthpiece of the wind instrument to a second sound receiving point inside the mute or near the mute in a state where the mute is used, and second transfer characteristic (G2) from the first sound receiving point to a third sound receiving point near a bell (13) or a position of an ear of a player in a state where the mute is not used.

Further, the first mode may be as follows. With vibrations being applied to a prescribed position of the wind instrument having the mute, an electric signal (S0) converted from a sound collected at a prescribed first sound receiving point which is the prescribed position or is near the prescribed position, and an electric signal (S1) converted from a sound collected at a prescribed second sound receiving point situated inside the mute or near a bell of the wind instrument are obtained to previously obtain an inverse function ($G1^{-1}$) of a first transfer function (G1) representative of changes in frequency characteristic from the sound collected at the first sound receiving point to the sound collected at the second sound receiving point by use of the obtained two electric signals (S0 and S1); with vibrations being applied to the prescribed position of the wind instrument without the mute, an electric signal (S0) converted from a sound collected at the first sound receiving point and an electric signal (S2) converted from a sound collected at a prescribed third sound receiving point situated outside the wind instrument are obtained to previously obtain a second transfer function (G2) representative of changes in frequency characteristic from the sound collected at the first sound receiving point to the sound collected at the third sound receiving point by use of the obtained two electric signals (S0 and S2); and the signal processing circuit receives the electric signal converted from the sound collected at the second sound receiving point as an electric signal converted from a sound generated with the mute being used, the signal processing circuit further processing the received electric signal on the basis of a composite transfer function ($G12=G1^{-1}\cdot G2$) obtained by combining the previously obtained inverse function ($G1^{-1}$) of the first transfer function (G1) and the previously obtained second transfer function (G2), and outputting the processed signal. In this case, the prescribed position where vibrations are applied is a mouthpiece or a position near the mouthpiece, for example.

In the second mode, the signal processing circuit receives an electric signal (S1) converted from a sound collected inside the mute or near the mute in a state where the mute is used, and processes the received electric signal on the basis of transfer characteristic (G12), the transfer characteristic being calculated on the basis of a sound signal (S1) at a second sound receiving point inside the mute or near the mute in a state where the mute is used and a sound signal (S2) at a third sound receiving point near a bell or a position of an ear of a player in a state where the mute is not used.

Further, the second mode may be as follows. With vibrations being applied to a prescribed position of the wind instrument having the mute, an electric signal (S1) converted from a sound collected at a prescribed second sound receiving point situated inside the mute or near a bell of the wind instrument is obtained, while an electric signal (S2) converted from a sound collected at a prescribed third sound receiving point situated outside the wind instrument is also obtained with vibrations being applied to the prescribed position of the wind instrument without the mute, similarly to the vibrations applied to the wind instrument having the mute, to previously obtain a transfer function (G12) representative of changes in frequency characteristic from the sound collected at the second sound receiving point to the sound collected at the third sound receiving point by use of the obtained two electric signals (S1 and S2); and the signal processing circuit receives the electric signal converted from the sound collected at the second sound receiving point as an electric signal converted from a sound generated with the mute being used, the signal processing circuit further processing the received electric signal on the basis of the obtained transfer function (G12), and outputting the processed signal. In this case as well, the prescribed position where vibrations are applied is a mouthpiece or a position near the mouthpiece, for example.

In the third mode, the signal processing circuit receives an electric signal (S1) converted from a sound collected inside the mute or near the mute in a state where the mute is used, and the signal processing circuit processes the received electric signal on the basis of inverse characteristic ($G1^{-1}$) of first transfer characteristic (G1) from a first sound receiving point inside a mouthpiece or near the mouthpiece of a first wind instrument to a second sound receiving point inside the mute or near the mute of the first wind instrument in a state where the mute is used, and second transfer characteristic (G2) from a third sound receiving point inside a mouthpiece or near the mouthpiece of a second wind instrument to a forth sound receiving point near a bell or a position of an ear of a player of the second wind instrument in a state where the mute is not used.

Further, the third mode may be as follows. With vibrations being applied to a prescribed position of a first wind instrument having the mute, an electric signal (S0) converted from a sound collected at a prescribed first sound receiving point which is the prescribed position or is near the prescribed position and an electric signal (S1) converted from a sound collected at a prescribed second sound receiving point situated inside the mute or near a bell of the first wind instrument are obtained to previously obtain an inverse function ($G1^{-1}$) of a first transfer function (G1) representative of changes in frequency characteristic from the sound collected at the first sound receiving point to the sound collected at the second sound receiving point by use of the obtained two electric signals (S0 and S1); with vibrations being applied to a prescribed position of a second wind instrument which does not have the mute and is different from the first wind instrument, an electric signal (S0) converted from a sound collected at a prescribed first sound receiving point which is the prescribed position or is near the prescribed position, and an electric signal (S2) converted from a sound collected at a prescribed third sound receiving point situated outside the second wind instrument are obtained to previously obtain a second transfer function (G2) representative of changes in frequency characteristic from the sound collected at the first sound receiving point to the sound collected at the third sound receiving point by use of the obtained two electric signals (S0 and S2); and the signal processing circuit receives the electric signal converted from the sound collected at the second sound receiving point as an electric signal converted from a sound generated with the mute being used, the signal processing circuit further processing the received electric signal on the basis of a composite transfer function ($G12=G1^{-1}\cdot G2$) obtained by combining the previously obtained inverse function ($G1^{-1}$) of the first transfer function (G1) and the previously obtained second transfer function (G2), and outputting the processed signal. In this case as well, the prescribed position where vibrations are applied is a mouthpiece or a position near the mouthpiece, for example.

When a wind instrument is played with a mute being used, changes in frequency characteristic of sounds generated by the instrument arise, compared with a case where the mute is not used. According to the present invention configured as above, however, the signal processing circuit cancels the changes in frequency characteristic of sounds caused by the mute. Even when the wind instrument is played with the mute being attached, therefore, the present invention allows a player to comfortably listen to favorable sounds of the wind instrument similar to sounds of the wind instrument without the mute.

In the first mode, more specifically, the signal processing circuit processes signals on the basis of the composite transfer function ($G1^{-1}\cdot G2$) obtained by combining the inverse function ($G1^{-1}$) of the first transfer function (G1) and the second transfer function (G2) provided for one wind instrument. In the second mode as well, furthermore, the signal processing circuit processes signals on the basis of the transfer function (G12) for one wind instrument. By the first and second modes, therefore, sounds of a wind instrument that is played by a player are to be reproduced. In the third mode, however, the signal processing circuit processes signals on the basis of the composite transfer function ($G12=G1^{-1}\cdot G2$) obtained by combining the inverse function ($G1^{-1}$) of the first transfer function (G1) provided for the first wind instrument and the second transfer function (G2) provided for the second wind instrument which is different from the first wind instrument. By the third mode, therefore, sounds of the second wind instrument which is different from the first wind instrument played by the player are to be reproduced.

DESCRIPTION OF THE PREFERRED EMBODIMENT

Figure 1:
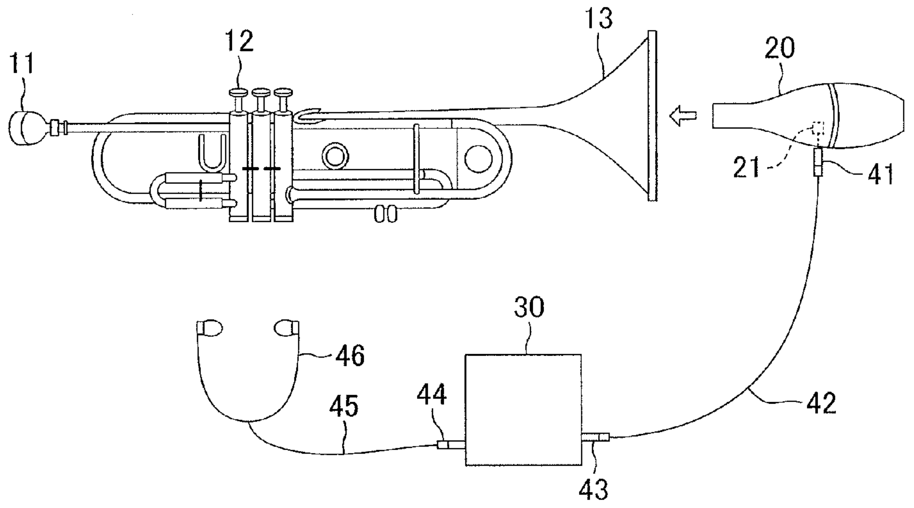
FIG. 1 is a schematic diagram indicating an entire sound system in which a mute unit and a signal processor according to the present invention are applied to a trumpet.

A signal processor according to an embodiment of the present invention will now be described. FIG. 1 is a schematic diagram indicating the entire sound system in which a mute unit (a mute) and a signal processor according to the present invention are applied to a trumpet.

The trumpet has a mouthpiece 11, piston valves 12 and a bell 13. The mouthpiece 11 is situated at one end of a tube and is an inlet portion of breath. The bell 13 is situated at another end of the tube and a portion which is a near an outlet of breath in which a diameter of a tube is gradually broadened for increasing volume of sounds. The piston valves 12 are situated midway of the tube. A mute unit (a silencer unit) 20 is a hollow cylindrical body which has a large diameter at the center of the mute unit 20 in the axis direction and whose diameter gradually decreases toward both ends of the mute unit 20 in the axis direction. The mute unit 20 is inserted from the end of the bell 13, so that the mute unit 20 is installed on the trumpet to mute (reduce) volume of sounds generated by the trumpet. In other words, the mute unit 20 lowers the volume at least. Inside the mute unit 20, a microphone 21 is embedded, so that the microphone 21 can collect sounds emitted inside the wind instrument (that is, not the sounds which are to be emitted outside the wind instrument, but the sounds muted by the mute unit 20) to convert the collected sounds to electric signals to output the converted signals.

The electric signals are supplied from the microphone 21 to a signal processor 30. In this case, more specifically, the electric signals are supplied from the microphone 21 to the signal processor 30 via a connector 41 connected with the mute unit 20 so that the connector 41 can be detached, a cable 42, and a connector 43 connected with the signal processor 30 so that the connector 43 can be detached. The signal processor 30 processes electric signals supplied from the microphone 21, and supplies the processed electric signals to a set of earphones 46 via a detachable connector 44 connected with the signal processor 30 and a cable 45.

Figure 2:
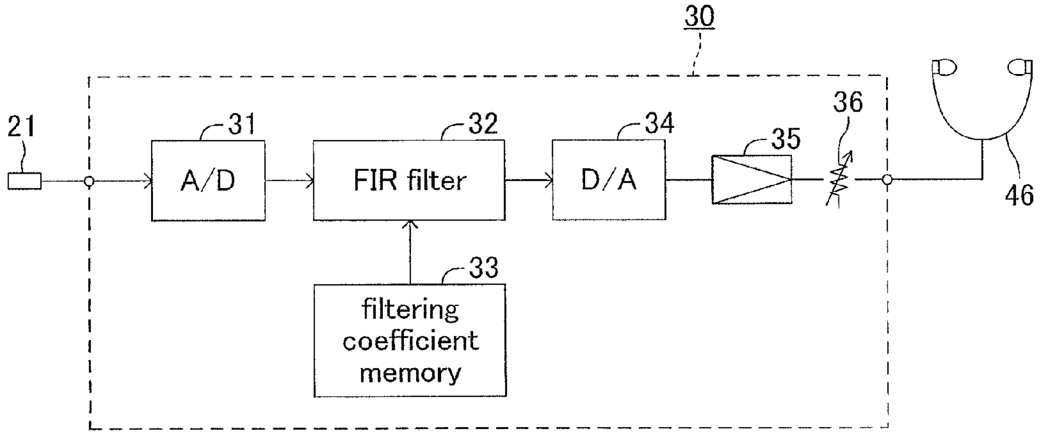
FIG. 2 is a circuit block diagram indicative of the signal processor shown in FIG. 1.

As indicated in FIG. 2, the signal processor 30 has an A/D converter 31, a FIR (Finite Impulse Response) filter 32, a filtering coefficient memory 33, a D/A converter 34, an amplifier 35 and a volume 36. The A/D converter 31 converts analog electric signals received from the microphone 21 to digital signals. The analog-to-digital converted signals are then supplied to the FIR filter 32. By performing convolution operation on the received digital signals by use of filtering coefficients, the FIR filter 32 changes frequency characteristic of the received digital signals on the basis of a transfer function to output the changed signals to the D/A converter 34. The transfer function will be referred to as G12 in this embodiment. The filtering coefficient memory 33 stores filtering coefficients necessary for the convolution operation performed by the FIR filter 32, and supplies the filtering coefficients to the FIR filter 32. The D/A converter 34 converts the received digital signals to analog signals, and then outputs the analog signals to the amplifier 35. The amplifier 35 amplifies the analog signals supplied from the D/A converter 34, and then outputs the amplified signals to the earphones 46 via the volume 36. In accordance with user's manipulation of an operating element which is not shown but is provided on the signal processor 30, the volume 36 variably controls the level of analog signals which are to be output from a signal processing circuit.

Now, the transfer function G12 of the FIR filter 32 obtained by the convolution operation by use of the filtering coefficients will be explained. The transfer function G12 is to be obtained through the first to third processes which will be described later, while the filtering coefficients for obtaining the transfer function G12 are previously stored in the filtering coefficient memory 33.

Figure 3:
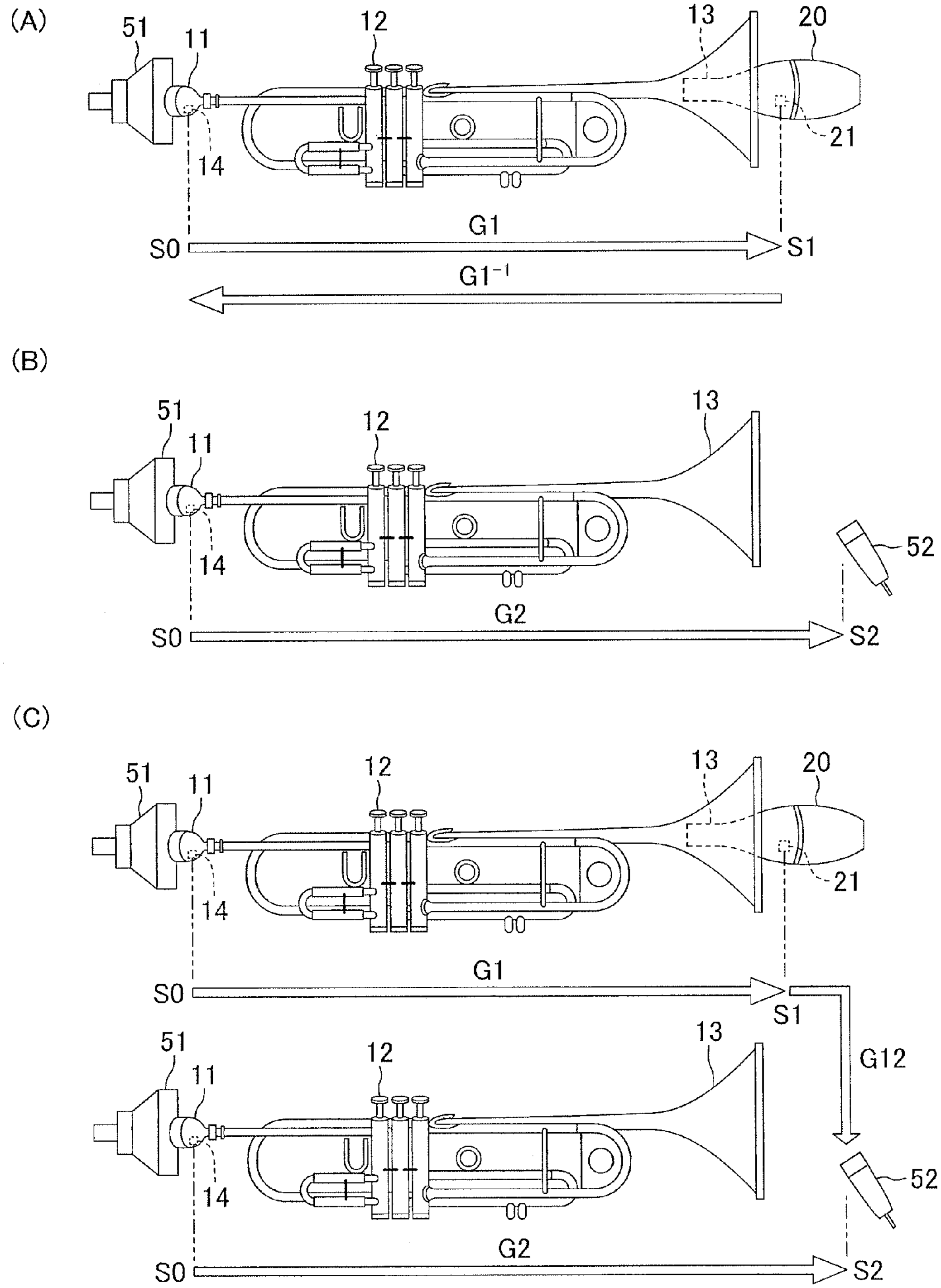
FIGS. 3 (A) to (C) are illustrations explaining the first to third processes for obtaining coefficients (impulse responses) of a FIR filter shown in FIG. 2.

At the first process, in a state where the mute unit 20 is installed on the bell 13, a transfer function G1 representative of changes in frequency characteristic (frequency distribution characteristic) from a sound (sound signal which is air vibrations) collected at a prescribed first sound receiving point (in this embodiment, an air passageway of the mouthpiece 11) to a sound (sound signal which is air vibrations) collected at a second sound receiving point (a position where the microphone 21 collects sounds) situated inside the mute unit 20 is obtained to obtain an inverse function $G1^{-1}$ by use of the above-obtained transfer function G1. As indicated in FIG. 3(A), more specifically, a speaker 51 which is a vibration exciter is mounted on the mouthpiece 11, with the mute unit 20 being attached to the bell 13, while measurement signals (e.g., white noise signals, random signals, or the like) are supplied to the speaker 51. In this state, by use of a microphone 14 embedded in the mouthpiece 11, a sound is collected on the air passageway of the mouthpiece 11 to convert the collected sound to an electric signal to obtain the electric signal. Concurrently, a sound is collected by the microphone 21 embedded in the mute unit 20 to convert the collected sound to an electric signal to obtain the electric signal.

Taking the electric signal corresponding to the sound collected by the microphone 14 as S0, and the electric signal corresponding to the sound collected by the microphone 21 as S1, the transfer function G1 for converting the electric signal S0 to the electric signal S1 is calculated (see the upper arrow of FIG. 3(A)). In other words, the first transfer function G1 representative of changes in frequency characteristic from the sound situated at the first sound receiving point to the sound situated at the second sound receiving point is obtained. The relationship between the electric signals S0 and S1, and the transfer function G1 can be expressed as the following equation 1.

$$S1=G1\cdot S0 \quad \text{(equation 1)}$$

Then, the inverse function $G1^{-1}$ of the transfer function G1 is calculated by use of the transfer function G1 (see the lower arrow of FIG. 3(A)). Without obtaining the transfer function G1, an inverse function $G1^{-1}$ (the same as the above-described inverse function $G1^{-1}$) may be directly obtained by use of the electric signals S0 and S1.

At the second process, in a state where the mute unit 20 is not mounted on the bell 13, a transfer function G2 representative of changes in frequency characteristic (frequency distribution characteristic) from a sound situated at the first sound receiving point which is the same point as the first sound receiving point of the first process to a sound situated at a prescribed position (the third sound receiving point) situated outside the trumpet is obtained. As indicated in FIG. 3(B), more specifically, in a state where the mute unit 20 is not mounted on the bell 13, the speaker 51 which is a vibration exciter is mounted on the mouthpiece 11, with a microphone 52 being placed at the prescribed position (the third sound receiving point) located outside the trumpet, while measurement signals (e.g., white noise signals, random signals, or the like) are supplied to the speaker 51 similarly to the first process. In this state, similarly to the first process, an electric signal converted from a sound collected by the microphone 14 is obtained. Concurrently, a sound is collected by the microphone 52 to convert the collected sound to an electric signal to obtain the electric signal. In FIG. 3(B), furthermore, the third sound receiving point is situated diagonally in front of the bell 13. However, the third sound receiving point may be situated at any other positions such as a position located in front of the bell 13 or a position of an ear of a player who plays the trumpet.

Taking the electric signal corresponding to the sound collected by the microphone 14 as S0, and the electric signal corresponding to the sound collected by the microphone 52 as S2, the transfer function G2 for converting the electric signal S0 to the electric signal S2 is calculated. The relationship between the electric signals S0 and S2, and the transfer function G2 can be expressed as the following equation 2.

$$S2=G2\cdot S0 \quad \text{(equation 2)}$$

At the third process, a transfer function G12 representative of changes in frequency characteristic (frequency distribution characteristic) from a sound situated at the second sound receiving point (a position where the microphone 21 collects sounds) used at the first process and situated inside the mute unit 20 to a sound situated at the third sound receiving point used at the second process and situated outside the trumpet is obtained. In this case, taking the electric signal corresponding to the sound of the second sound receiving point situated inside the mute unit 20 as S1, and the electric signal corresponding to the sound of the third sound receiving point situated outside the trumpet as S2, with a transfer function being defined as G12, the relationship can be expressed as the following equation 3 (see FIG. 3(C)).

$$S2=G12\cdot S1 \quad \text{(equation 3)}$$

Furthermore, by altering the equation 3 to substitute the electric signals S1 and S2 used in the equations 1 and 2 into the equation 3, the relationship can be expressed as the following equation 4.

$$G12=S2/S1=(G2\cdot S0)/(G1\cdot S0)=G1^{-1}\cdot G2 \quad \text{(equation 4)}$$

Figure 4:
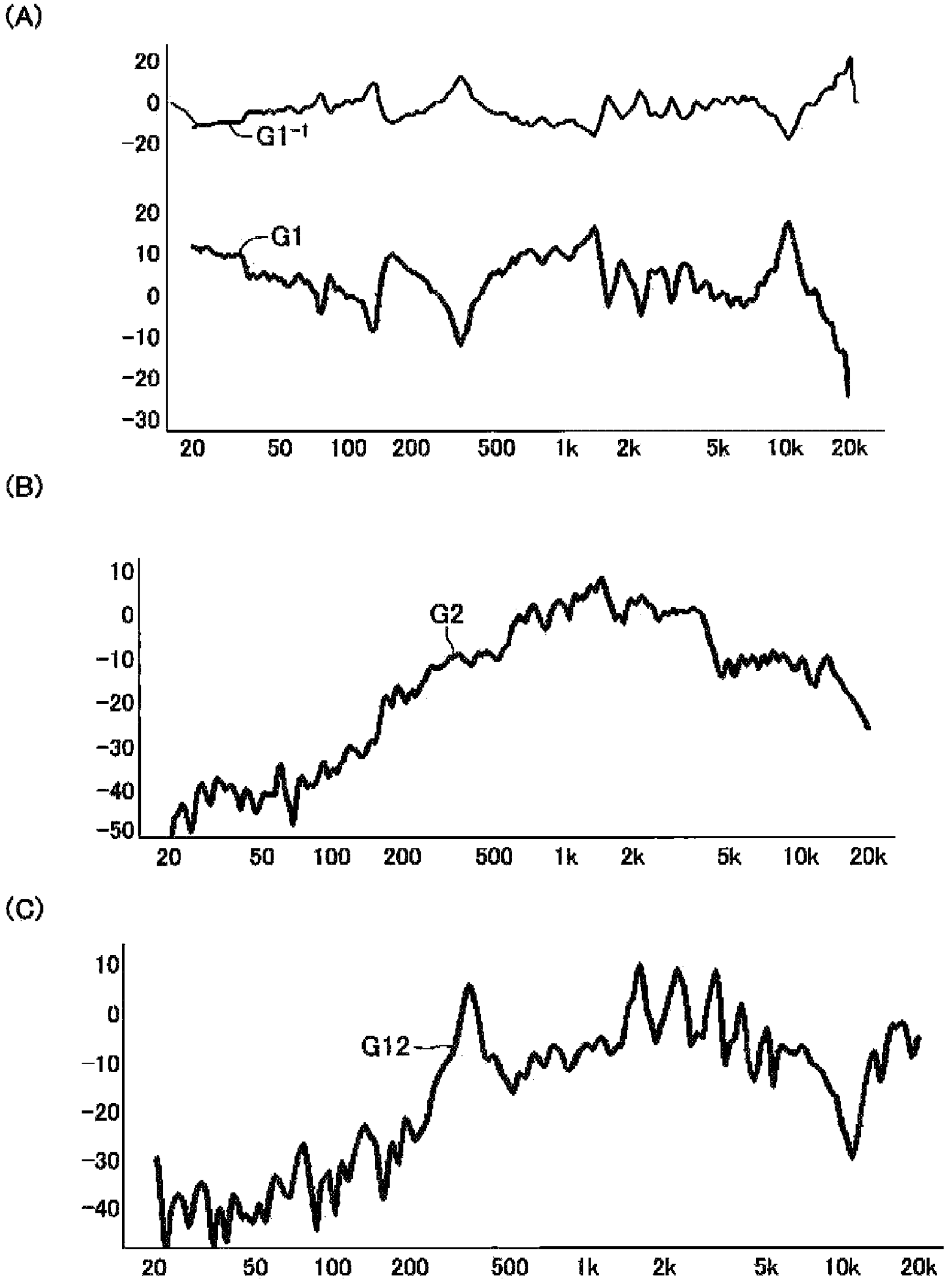
FIGS. 4 (A) to (C) are graphs representative of frequency characteristics of signals brought about by transfer functions calculated at the first to third processes.

According to the equation 4, the transfer function G12 can be obtained by combining (multiplying) the transfer function G2 with the inverse function $G1^{-1}$ which is an inverse function of the transfer function G1. At the third process, therefore, the transfer function G2 obtained at the second process is combined (multiplied) with (by) the inverse function $G1^{-1}$ of the transfer function G1 obtained at the first process to obtain the transfer function G12 ($=G1^{-1}\cdot G2$). Then, filtering coefficients of the FIR filter 32 for realizing the conversion of electric signals based on the transfer function G12 are determined to be stored in the filtering coefficient memory 33. FIG. 4 indicates frequency characteristics of signals of these transfer functions G1, $G1^{-1}$, G2, and G12. More specifically, the lower part of FIG. 4(A) indicates the frequency characteristic corresponding to the transfer function G1, while the upper part of FIG. 4(A) indicates the frequency characteristic corresponding to the transfer function $G1^{-1}$ (the inverse function of the transfer function G1). FIG. 4(B) indicates frequency characteristic corresponding to the transfer function G2, while FIG. 4(C) indicates frequency characteristic corresponding to the transfer function G12.

The obtaining of the transfer functions and filtering coefficients has been briefly described above. However, electric signals (that is, electric signals converted from sounds) for sections are necessary for obtaining the transfer functions. In addition, the frequency characteristic of these electric signals (that is, frequency characteristic of the sounds) varies with time. In this specification, precisely speaking, descriptions about changes in frequency characteristic of sound and frequency characteristic of electric signal indicate time-varying frequency characteristic.

The method of obtaining the transfer functions and filtering coefficients will be explained concretely. First of all, the electric signals S0, S1 and S2 corresponding to the various sounds are separated into sections each having a certain period of time. Next, by use of two sets of electric signals corresponding to each section, a transfer function corresponding to changes in frequency characteristic (frequency distribution characteristic) of the two sets of electric signals is obtained for each section. Then, plural sets of filtering coefficients necessary for filtering signal processing (in this embodiment, processing by the FIR filter) for realizing the transfer functions of the respective sections are obtained to calculate respective mean values of the filtering coefficients of the respective sections to define the calculated mean values as the final filtering coefficients. The calculation of the mean values of the filtering coefficients can be done by various schemes. For instance, filtering coefficients of each section are combined together to divide by the number of sections to define respective mean values of the filtering coefficients as final filtering coefficients. Alternatively, mean values of filtering coefficients of the first section and the second section are calculated, respectively, to calculate mean values between the above-calculated mean values and filtering coefficients of the next section to repeat the calculation of mean values to reach the last section to obtain the final filtering coefficients.

As for obtaining the transfer function G12 and filter coefficients, because eight different paths for sound signals are provided inside the trumpet by player's manipulation of the piston valves 12, there can be eight different transfer functions and eight different sets of filtering coefficients. Therefore, it is preferable to determine final transfer function and filtering coefficients by using the following method. At first, eight different transfer functions and eight different sets of filtering coefficients are obtained by the above-described scheme through player's manipulation of the piston valves 12. Next, the mean values of the eight different sets of filtering coefficients are calculated to determine the mean values as the final filtering coefficients. And the final transfer function is also determined based on the final filtering coefficients. Although it is preferable to obtain the eight sets of filtering coefficients to determine the final transfer function and filtering coefficients, the final transfer function and filtering coefficients may be determined by obtaining only one average transfer function and its filtering coefficients. Further, the final transfer function and filtering coefficients may be determined by using plural sets of filtering coefficients less than eight sets of filtering coefficients.

In the above-described embodiment, measurement signals are supplied to the mouthpiece 11 by use of the speaker 51, so that the microphones 14, 21 and 52 can obtain the electric signals S0, S1 and S2. However, the above-described embodiment may be modified such that in response to player's actual musical performance on the trumpet, that is, in response to vibrations applied to the mouthpiece 11 by a player blowing through the mouthpiece 11, the electric signals S0, S1 and S2 are obtained by the microphones 14, 21 and 52 at the above-described first and second processes to obtain the transfer functions G1, $G1^{-1}$, G2 and G12 by use of the obtained electric signals S0, S1 and S2 at the first to third processes.

In the above-described embodiment, furthermore, the inverse function $G1^{-1}$ of the transfer function G1 and the transfer function G2 are obtained to obtain the transfer function G12 ($=G1^{-1}\cdot G2$) by use of the inverse function $G1^{-1}$ and the transfer function G2. However, the above-described embodiment may be modified such that on condition that the completely same environment except the existence of the mute unit 20 is provided, with the same vibrations being applied to the mouthpiece 11, the transfer function G12 (=S2/S1) is obtained by use of the two electric signals S1 and S2, without obtaining the transfer functions G1 and G2, and the inverse function $G1^{-1}$ (see the equation 4).

The transfer function G12 ($=G1^{-1}\cdot G2$) will now be explained from physical perspective. The inverse function $G1^{-1}$ is a transfer function for removing changes in frequency characteristic caused by the trumpet downstream from the mouthpiece 11 and the mute unit 20 from the frequency characteristic of sounds collected by the microphone 21 provided on the mute unit 20 in a state where the mute unit 20 is attached to the trumpet. In other words, the inverse function $G1^{-1}$ is a transfer function for restoring sounds collected by the microphone 21 provided on the mute unit 20 to the sounds situated inside the mouthpiece 11. The transfer function G2 is a transfer function for changing frequency characteristic of sounds situated inside the mouthpiece 11 to frequency characteristic of sounds of the prescribed position situated outside the trumpet in a state where the mute unit 20 is not attached to the trumpet. Therefore, the transfer function G12 obtained by combining (multiplying) the inverse function $G1^{-1}$ and the transfer function G2 is a transfer function for cancelling changes in trumpet sound characteristics of a state where the mute unit 20 is attached to the bell 13 to change (convert) the sounds collected by the microphone 21 provided on the mute unit 20 to sounds having sound characteristics of a portion situated downstream from the mouthpiece 11 in a state where mute unit 20 is not attached to the bell 13. In other words, the transfer function G12 is a transfer function for reproducing sounds in which changes in frequency characteristic of sound signals brought about by the mute unit 20 have been removed, based on sounds collected by the microphone 21 provided on the mute unit 20.

Next, operation of the embodiment configured as described above will be explained. A player prepares the mute unit 20 and the signal processor 30. Then, the player inserts the mute unit 20 into the bell 13 to mount the mute unit 20 on the trumpet, connects the connector 41 to the mute unit 20, connects the connectors 43 and 44 to the signal processor 30, and wears the earphones 46. Then, the player starts playing the trumpet. In this case, because the mute unit 20 mutes (reduces the volume of) sounds generated by the trumpet, loud sounds are not to be emitted outside the trumpet.

The microphone 21 collects sounds inside the mute unit 20, and supplies electric signals converted from the collected sounds to the signal processor 30 through the connector 41, the cable 42 and the connector 43. The signal processor 30 converts the supplied electric signals (analog signals) to digital signals at the A/D converter 31, and then supplies the converted digital signals to the FIR filter 32. By performing convolution operation on the received digital signals by use of the filtering coefficients stored in the filtering coefficient memory 33, the FIR filter 32 changes frequency characteristic of the received digital signals in accordance with the transfer function G12, and then supplies the changed signals to the D/A converter 34. The D/A converter 34 converts received digital signals to analog signals, and then supplies the converted analog signals to the earphones 46 through the amplifier 35 and the volume 36. Therefore, the player is to listen to sounds having frequency characteristic changed by the FIR filter 32 from the sounds retrieved in the mute unit 20 by the microphone 21.

In this case, the transfer function G12 used by the FIR filter 32 reproduces sounds brought about by sound characteristics of trumpet without the mute unit 20, based on sounds collected by the microphone 21 provided inside the mute unit 20. Even with the mute unit 20 being attached to the trumpet, therefore, the player is to listen to sounds in which changes in frequency characteristic (sound characteristics) caused by the mute unit 20 such as operation noise generated by manipulation of the piston valves 12, noise caused by tonguing, muffled sounds caused by the mute unit 20 (muted sounds), and disturbing high frequency noise have been cancelled. According to the above-described embodiment, as a result, even in a case where the player plays the trumpet with the mute unit 20 being mounted, the player can comfortably listen to favorable musical sounds similar to sounds of a case where the player plays a trumpet without the mute unit 20.

The present invention is not limited to the above-described embodiment, but can be variously modified without departing from the object of the invention.

Figure 5:
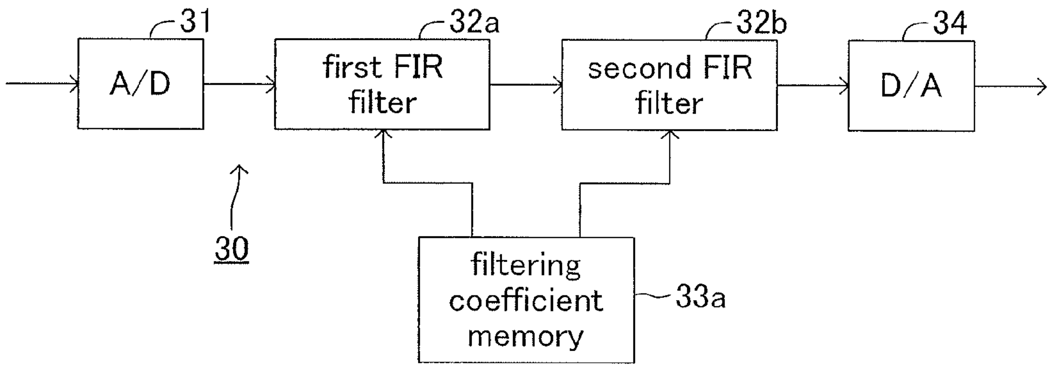
FIG. 5 is a circuit block diagram indicative of a part of a signal processor according to a modification of the embodiment.

In the above-described embodiment, the FIR filter 32 changes signal properties by use of the transfer function G12 ($=G1^{-1}\cdot G2$). Instead of the FIR filter 32, however, as indicated in FIG. 5, a first FIR filter 32*a* and a second FIR filter 32*b* placed in series may be used in order to change signal properties similarly to the above-described embodiment. In this modification, the first FIR filter 32*a* uses the above-described inverse function $G1^{-1}$ as a transfer function, while the second FIR filter 32*b* uses the above-described transfer function G2 as a transfer function. Therefore, a filtering coefficient memory 33*a* previously stores filtering coefficients for allowing the first FIR filter 32*a* to realize transfer properties of the inverse function $G1^{-1}$ and filtering coefficients for allowing the second FIR filter 32*b* to realize transfer properties of the transfer function G2, and supplies the filtering coefficients to the first FIR filter 32*a* and the second FIR filter 32*b*. The filtering coefficients for the first FIR filter 32*a* and the filtering coefficients for the second FIR filter 32*b* are obtained by a scheme similar to the first and second process of the embodiment. Except the above, this modification is configured similarly to the above-described embodiment.

The above-described modification can also achieve the composition (multiplication) of the inverse function $G1^{-1}$ and the transfer function G2 by the series-connected first FIR filter 32*a* and second FIR filter 32*b* to realize the transfer properties brought about by the transfer function G12 ($=G1^{-1}\cdot G2$) which is similar to that of the above-described embodiment. As a result, the modification can produce an effect similar to that produced by the above-described embodiment.

In the above-described embodiment, furthermore, a set of filtering coefficients for allowing the FIR filter 32 to realize the transfer function G12 ($=G1^{-1}\cdot G2$) is stored in the filtering coefficient memory 33. Instead of the filtering coefficient memory 33, however, a filtering coefficient memory 33*b* according to a modification indicated in FIG. 6 may store plural sets of filtering coefficients for allowing the FIR filter 32 to realize different kinds of transfer properties. The plural sets of filtering coefficients include two cases which will be described below.

In the first case, the plural sets of filtering coefficients are the coefficients that allow the FIR filter 32 to realize different transfer functions G12 corresponding to different transfer functions G2, respectively, which achieve transfer properties of sound signals from the first sound receiving point (a position where the microphone 14 collects sounds) which is situated inside the mouthpiece 11 and is the same point as the first embodiment to plural different positions (the third sound receiving points) situated outside the trumpet. As for the first to third processes for obtaining the transfer functions G12, in this case, the transfer function G1 and the inverse function $G1^{-1}$ (or only the inverse function $G1^{-1}$) are obtained at the first process by the manner similar to the first process of the above-described embodiment. At the second process, the plural different transfer functions G2 are obtained, with the plural positions situated outside the trumpet being defined as the third sound receiving points. At the third process, by use of the inverse function $G1^{-1}$ and the plural transfer functions G2 obtained at the first process and the second process, the plural transfer functions G12 and plural sets of filtering coefficients are obtained similarly to the first embodiment. The obtained plural sets of filtering coefficients are stored in the filtering coefficient memory 33*b*.

As for the second case, furthermore, the plural sets of filtering coefficients are the coefficients that allow the FIR filter 32 to realize plural different transfer functions G12 corresponding to different transfer functions G2, respectively, by which frequency characteristic of sound signals brought about by the transfer function G2 of the above-described embodiment is changed to various frequency characteristics of sound signals irrespective of the above-described positions (the third sound receiving points). For obtaining the plural sets of filtering coefficients, although the transfer function G2 or the transfer function G12 obtained in the above-described embodiment may be merely changed, sounds of existing wind instruments can be mimicked more accurately by a scheme described below.

In this scheme as well, at the first process, the transfer function G1 and the inverse function $G1^{-1}$ (or only the inverse function $G1^{-1}$) are obtained by the same manner as the first process of the above-described embodiment. At the second process, in a state where the mute unit 20 is not used, vibrations are applied to respective mouthpieces or positions near the respective mouthpieces of different kinds of wind instruments (e.g., horn, trombone, saxophone, clarinet and the like) which are different from the wind instrument (in this embodiment, the trumpet) to which vibrations are applied at the first process to define the mouthpieces or the nearby positions as the first sound receiving points to obtain electric signals converted from sounds situated at the first sound receiving points. In addition, with respective prescribed positions situated outside the different kinds of wind instruments being defined as the third sound receiving points, electric signals converted from sounds situated at the third sound receiving points are obtained. Then, the plural second transfer functions G2 indicative of respective changes in frequency characteristic from the sounds of the first sound receiving points to the sounds of the third sound receiving points are obtained by use of the above-obtained two electric signals. At the third process, by use of the inverse function $G1^{-1}$ and the plural transfer functions G2 obtained at the first and second processes, the plural transfer functions G12 and plural sets of filtering coefficients are obtained similarly to the first embodiment. The obtained plural sets of filtering coefficients are to be stored in the filtering coefficient memory 33*b*.

In this modification, furthermore, the signal processor 30 has a selecting portion 37 and a filtering property setting portion 38. The selecting portion 37 has selecting switches for allowing a player to select a set of filtering coefficients from among the plural sets of filtering coefficients stored in the filtering coefficient memory 33*b*. The filtering property setting portion 38 reads out the set of filtering coefficients selected by use of the selecting portion 37 from the filtering coefficient memory 33*b* and supplies the read filtering coefficients to the FIR filter 32 to allow the FIR filter 32 to realize transfer properties according to one of the transfer functions G12. Except the above, this modification is configured similarly to the above-described embodiment. This modification enables realization of any one of frequency characteristics of sound signals of different positions situated outside the trumpet or frequency characteristics of different kinds of sound signals according to a player's preference. Furthermore, by obtaining transfer functions G12 relating to different kinds of wind instruments as the above-described different transfer functions G12 to be stored in the filtering coefficient memory 33*b*, the trumpet can generate sounds of the different kinds of wind instruments which are not the trumpet from the earphones 46 in accordance with player's performance on the trumpet.

Figure 6:
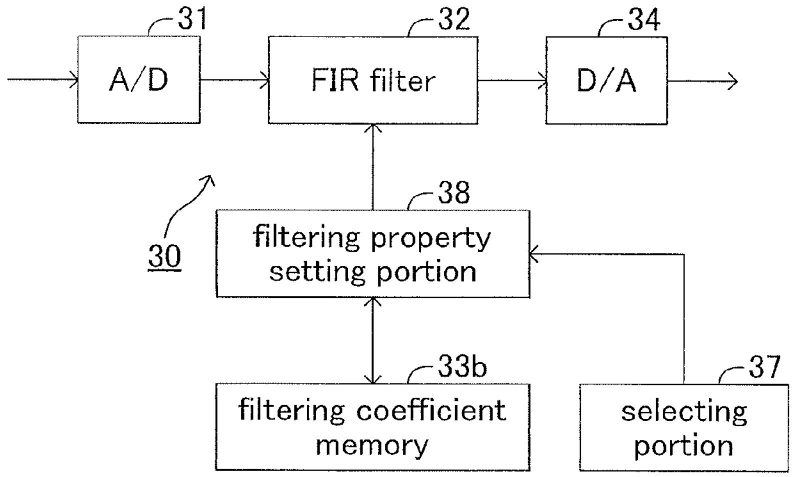
FIG. 6 is a circuit block diagram indicative of a part of a signal processor according to another modification of the embodiment.
Figure 7:
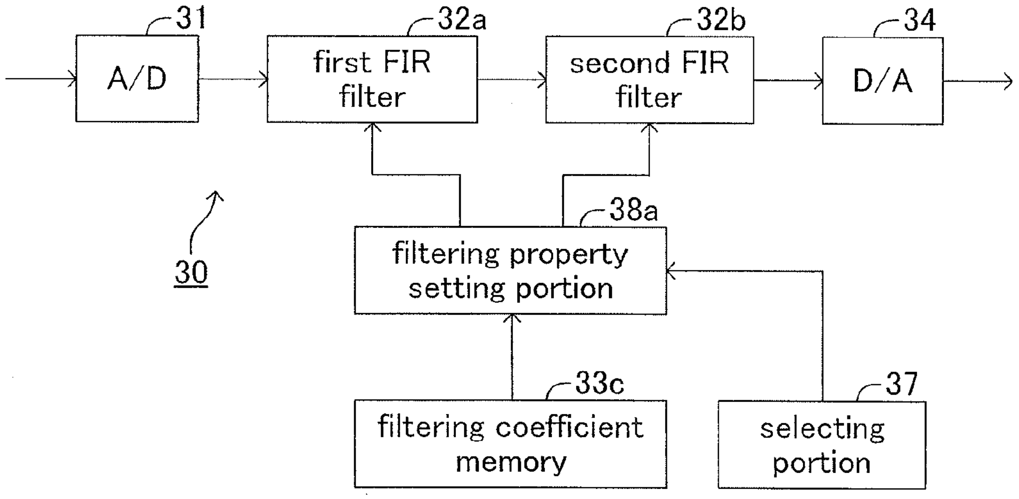
FIG. 7 is a circuit block diagram indicative of a part of a signal processor according to the other modification of the embodiment.

Furthermore, the selection of any one of the different transfer functions G12 according to the modification shown in FIG. 6 can be also applied to the modification shown in FIG. 5. In this modification, similarly to the modification of FIG. 5, the signal processor 30 has the first FIR filter 32*a* and the second FIR filter 32*b* as indicated in FIG. 7. Furthermore, a filtering coefficient memory 33*c* stores not only a set of filtering coefficients corresponding to the inverse function $G1^{-1}$ similar to the modification of FIG. 5 but also plural sets of filtering coefficients corresponding to different transfer functions G2, respectively, for obtaining different kinds of transfer functions G12 which are similar to those of the modification shown in FIG. 6 by combining (multiplying) the inverse function $G1^{-1}$. Furthermore, a filtering property setting portion 38*a* reads out the set of filtering coefficients corresponding to the inverse function $G1^{-1}$ from the filtering coefficient memory 33*c*, and supplies the read set of filtering coefficients to the first FIR filter 32*a*. Concurrently, in accordance with the selection made by use of the selecting portion 37 configured similarly to the case of the modification of FIG. 6, the filtering property setting portion 38*a* selects one of the plural sets of filtering coefficients corresponding to the different transfer functions G2, respectively, reads out the selected set of filtering coefficients from the filtering coefficient memory 33*c*, and then supplies the read filtering coefficients to the second FIR filter 32*b*. Except the above, this modification is configured similarly to the above-described embodiment.

As a result, similarly to the case of the modification of FIG. 5, this modification can achieve the composition (multiplication) of the inverse function $G1^{-1}$ and the transfer function G2 by the first FIR filter 32*a* and second FIR filter 32*b*. In this modification, furthermore, because one of the sets of filtering coefficients corresponding to the different transfer functions G2, respectively, is supplied by the selection done by the selecting portion 37 to the second FIR filter 32*b*, a transfer property corresponding to one of the transfer functions G12 is realized. Similarly to the case of the modification of FIG. 6, therefore, this modification enables realization of any one of frequency characteristics of sound signals of different positions situated outside the trumpet or frequency characteristics of different kinds of sound signals, particularly any one of the sound signal properties of wind instruments other than the trumpet according to a player's preference.

In the above-described embodiment, furthermore, the microphone 21 is housed in the mute unit 20. However, the microphone 21 may be provided outside the mute unit 20, for example at the outside of the left end of the mute unit 20 shown in FIG. 1, or may be provided inside the bell 13. In this case, at the first process of the above-described embodiment, the microphone 21 is to be placed at the above-described position with the mute unit 20 being mounted on the trumpet, while the electric signals S0 and S1 are obtained to obtain the inverse function $G1^{-1}$ of the transfer function G1. The second and third processes of this case are the same as the first embodiment. In this case as well, furthermore, the microphone 14 is to be placed inside the mouthpiece 11.

Furthermore, the position of the microphone 14 is not limited to the position where the microphone 14 is embedded in the above-described embodiment as long as the microphone 14 is situated near the mouthpiece 11 to be on the path of sound signals. More specifically, the microphone 14 may be placed inside or near the mouthpiece 11 to obtain the electric signal S0.

Furthermore, the above-described embodiment has been explained as an example in which the present invention is applied to a trumpet. However, the present invention can be also applied to the other brass instruments such as trombone and horn. In addition, the present invention can be applied not only to brass instruments but also to wood wind instruments such as clarinet and saxophone. Furthermore, the present invention can be also applied to electronic wind instruments and hybrid wind instruments in which an electric instrument and an acoustic instrument are combined.

Furthermore, the above-described embodiment and modifications are designed such that the mute unit 20 is attached to a wind instrument. However, the present invention can be also applied to a case where a wind instrument is housed in a mute case (a mute) formed of an enclosed housing to mute sounds generated by the instrument to be emitted to the outside as in the case of Japanese Patent Publication No. 4521778 and Japanese Utility Model Registration No. 3145588 cited as prior arts in the above-described Related Art. Additionally, descriptions of these Japanese Patent Publication No. 4521778 and Japanese Utility Model Registration No. 3145588 are incorporated in the present specification. In this case, a microphone (a microphone corresponding to the microphone 21 of the above-described embodiment) may be provided inside the mute case formed of a housing which accommodates a wind instrument, with a microphone (a microphone corresponding to the microphone 14 of the above-described embodiment) being provided in a mouthpiece or near the mouthpiece of the wind instrument so that the inverse function $G1^{-1}$ of the transfer function G1 can be obtained by a manner similar to the first process explained in the above-described embodiment.

After the first process, the wind instrument is to be removed from the mute case formed of the housing to obtain the transfer function G2 as explained in the second process of the embodiment. Next, as explained in the third process of the embodiment, the transfer function G12 is to be obtained, while filtering coefficients are obtained to be stored in the filtering coefficient memory 33. When the wind instrument is played, the wind instrument is housed in the mute case formed of the housing to allow a player to listen to sounds collected by the microphone provided inside the mute case through earphones as explained in the above-described embodiment. This modification can also produce an effect similar to the effect produced by the above-described embodiment. In addition, this modification can be also variously modified, similarly to the above-described embodiment.

Furthermore, the above-described embodiment uses the mute unit 20 inserted into the bell 13 as a mute, while the above-described modification uses the mute case which accommodates a wind instrument as a mute. Instead of the mute unit 20 and the mute case, however, various things can be employed as a mute as long as these things can mute sounds. For instance, a plate member or a sheet member which covers the bell 13 may be employed to mute sounds. By inserting stuffing materials into the tube so that the stuffing materials can be placed between the bell 13 and the piston valves 12, furthermore, sounds can be muted.

In the above-described embodiment and the various modifications, vibrations are applied to the mouthpiece 11. However, vibrations may be applied to any part of the wind instrument. For example, vibrations may be applied to a blowing tube part of the wind instrument, that is, to the inlet of the blowing tube to which the mouthpiece 11 is connected. In this case, air vibrations are to be applied directly to the inlet of the blowing tube, passing through the mouthpiece 11 or removing the mouthpiece 11. Furthermore, vibrations may be applied to any part of the wind instrument other than the mouthpiece 11 and the blowing tube.

In the above-described embodiment, furthermore, electric signals processed by the signal processor 30 are supplied to the earphones 46 to allow a player to listen to sounds that the player plays. However, the embodiment may be modified such that the processed electric signals are supplied to a sound converter (e.g., a speaker) other than the earphones for converting the electric signals to sound signals (sounds) to allow the player or somebody other than the player to listen to the performance sound. In addition, electric signals which have yet to be supplied to the signal processor 30 (e.g., analog signals converted by the microphone 21 or digital signals converted from the analog signals) may be supplied to a different venue to process the signals there similarly to the signal processor 30 to allow an audience to listen to the sounds at the venue. In this case, for example, the digital signals converted from the analog signals are supplied over a network so that a signal processor connected to the network can process the signals.

In the above-described embodiment and its modifications, the FIR filter 32, the first FIR filter 32*a* and the second FIR filter 32*b* perform convolution operation on electric signals converted by the microphone 21 to change the frequency characteristic of the electric signals in accordance with the transfer functions G12, $G1^{-1}$ and G2. However, various signal processing circuits may be used as a signal processing circuit as long as the signal processing circuit can change the frequency characteristic of the electric signals in accordance with the transfer functions G12, $G1^{-1}$ and G2. For example, a DSP (digital signal processor), an EQ (equalizer) or the like can be used. Furthermore, the signal processor 30 can suffice as long as it can process electric signals converted by the microphone 21 and can supply the processed signals to the earphones 46. As the signal processor 30, therefore, various apparatuses such as a personal computer, a smart device and digital equipment can be used.

What is claimed is:

1. A signal processor for use in musical performance of a wind instrument using a mute for reducing volume of a sound generated by the wind instrument, the signal processor comprising:

a signal processing circuit which receives an electric signal converted from a sound generated in a state where the mute is used, processes the received electric signal to cancel changes in frequency characteristic of the sound caused by the mute, and then outputs the processed electric signal, wherein the signal processing circuit is formed of a FIR filter for performing convolution operation on a received electric signal, and a filtering coefficient memory storing filtering coefficients that is to be used for the convolution operation performed by the FIR filter to determine a transfer function.

2. The signal processor for musical performance of the wind instrument using the mute according to claim 1, wherein the filtering coefficient memory stores plural sets of filtering coefficients, and the signal processor further comprising;

a selecting portion which selects one set of filtering coefficients from among plural sets of filtering coefficients stored in the filtering coefficient memory to supply the selected one set of filtering coefficients to the FIR filter.

3. A signal processor for use in musical performance of a wind instrument using a mute for reducing volume of a sound generated by the wind instrument, the signal processor comprising:

a signal processing circuit which receives an electric signal converted from a sound generated in a state where the mute is used, processes the received electric signal to cancel changes in frequency characteristic of the sound caused by the mute, and then outputs the processed electric signal, wherein the signal processing circuit receives an electric signal converted from a sound collected inside the mute or near the mute in a state where the mute is used, and the signal processing circuit processes the received electric signal on the basis of inverse characteristic of first transfer characteristic from a first sound receiving point inside a mouthpiece or near the mouthpiece of the wind instrument to a second sound receiving point inside the mute or near the mute in a state where the mute is used, and second transfer characteristic from the first sound receiving point to a third sound receiving point near a bell or a position of an ear of a player in a state where the mute is not used.

4. A signal processor for use in musical performance of a wind instrument using a mute for reducing volume of a sound generated by the wind instrument, the signal processor comprising:

a signal processing circuit which receives an electric signal converted from a sound generated in a state where the mute is used, processes the received electric signal to cancel changes in frequency characteristic of the sound caused by the mute, and then outputs the processed electric signal, wherein with vibrations being applied to a prescribed position of the wind instrument having the mute, an electric signal converted from a sound collected at a prescribed first sound receiving point which is the prescribed position or is near the prescribed position, and an electric signal converted from a sound collected at a prescribed second sound receiving point situated inside the mute or near a bell of the wind instrument are obtained to previously obtain an inverse function of a first transfer function representative of changes in frequency characteristic from the sound collected at the first sound receiving point to the sound collected at the second sound receiving point by use of the obtained two electric signals;

with vibrations being applied to the prescribed position of the wind instrument without the mute, an electric signal converted from a sound collected at the first sound receiving point and an electric signal converted from a sound collected at a prescribed third sound receiving point situated outside the wind instrument are obtained to previously obtain a second transfer function representative of changes in frequency characteristic from the sound collected at the first sound receiving point to the sound collected at the third sound receiving point by use of the obtained two electric signals; and the signal processing circuit receives the electric signal converted from the sound collected at the second sound receiving point as an electric signal converted from a sound generated with the mute being used, the signal processing circuit further processing the received electric signal on the basis of a composite transfer function obtained by combining the previously obtained inverse function of the first transfer function and the previously obtained second transfer function, and outputting the processed signal.

5. The signal processor for musical performance of the wind instrument using the mute according to claim 4, wherein the vibrations are applied to a mouthpiece or a portion near the mouth piece.

6. A signal processor for use in musical performance of a wind instrument using a mute for reducing volume of a sound generated by the wind instrument, the signal processor comprising:

a signal processing circuit which receives an electric signal converted from a sound generated in a state where the mute is used, processes the received electric signal to cancel changes in frequency characteristic of the sound caused by the mute, and then outputs the processed electric signal, wherein with vibrations being applied to a prescribed position of the wind instrument having the mute, an electric signal converted from a sound collected at a prescribed second sound receiving point situated inside the mute or near a bell of the wind instrument is obtained, while an electric signal converted from a sound collected at a prescribed third sound receiving point situated outside the wind instrument is also obtained with vibrations being applied to the prescribed position of the wind instrument without the mute, similarly to the vibrations applied to the wind instrument having the mute, to previously obtain a transfer function representative of changes in frequency characteristic from the sound collected at the second sound receiving point to the sound collected at the third sound receiving point by use of the obtained two electric signals; and the signal processing circuit receives the electric signal converted from the sound collected at the second sound receiving point as an electric signal converted from a sound generated with the mute being used, the signal processing circuit further processing the received electric signal on the basis of the obtained transfer function, and outputting the processed signal.

7. The signal processor for musical performance of the wind instrument using the mute according to claim 6, wherein the vibrations are applied to a mouthpiece or a portion near the mouth piece.

8. A signal processor for use in musical performance of a wind instrument using a mute for reducing volume of a sound generated by the wind instrument, the signal processor comprising:

a signal processing circuit which receives an electric signal converted from a sound generated in a state where the mute is used, processes the received electric signal to cancel changes in frequency characteristic of the sound caused by the mute, and then outputs the processed electric signal, wherein the signal processing circuit receives an electric signal converted from a sound collected inside the mute or near the mute in a state where the mute is used, and the signal processing circuit processes the received electric signal on the basis of inverse characteristic of first transfer characteristic from a first sound receiving point inside a mouthpiece or near the mouthpiece of a first wind instrument to a second sound receiving point inside the mute or near the mute of the first wind instrument in a state where the mute is used, and second transfer characteristic from a third sound receiving point inside a mouthpiece or near the mouthpiece of a second wind instrument to a forth sound receiving point near a bell or a position of an ear of a player of the second wind instrument in a state where the mute is not used.

9. A signal processor for use in musical performance of a wind instrument using a mute for reducing volume of a sound generated by the wind instrument, the signal processor comprising:

a signal processing circuit which receives an electric signal converted from a sound generated in a state where the mute is used, processes the received electric signal to cancel changes in frequency characteristic of the sound caused by the mute, and then outputs the processed electric signal, wherein with vibrations being applied to a prescribed position of a first wind instrument having the mute, an electric signal converted from a sound collected at a prescribed first sound receiving point which is the prescribed position or is near the prescribed position and an electric signal converted from a sound collected at a prescribed second sound receiving point situated inside the mute or near a bell of the first wind instrument are obtained to previously obtain an inverse function of a first transfer function representative of changes in frequency characteristic from the sound collected at the first sound receiving point to the sound collected at the second sound receiving point by use of the obtained two electric signals;

with vibrations being applied to a prescribed position of a second wind instrument which does not have the mute and is different from the first wind instrument, an electric signal converted from a sound collected at a prescribed first sound receiving point which is the prescribed position or is near the prescribed position, and an electric signal converted from a sound collected at a prescribed third sound receiving point situated outside the second wind instrument are obtained to previously obtain a second transfer function representative of changes in frequency characteristic from the sound collected at the first sound receiving point to the sound collected at the third sound receiving point by use of the obtained two electric signals; and the signal processing circuit receives the electric signal converted from the sound collected at the second sound receiving point as an electric signal converted from a sound generated with the mute being used, the signal processing circuit further processing the received electric signal on the basis of a composite transfer function obtained by combining the previously obtained inverse function of the first transfer function and the previously obtained second transfer function, and outputting the processed signal.

10. The signal processor for musical performance of the wind instrument using the mute according to claim 9, wherein the vibrations are applied to a mouthpiece or a portion near the mouth piece.

* * * * *